United States Patent [19]  
Ito et al.

[11] Patent Number: 4,939,502  
[45] Date of Patent: Jul. 3, 1990

[54] DEVICE AND METHOD OF FAIL-SAFE CONTROL FOR ELECTRONICALLY CONTROLLED AUTOMATIC TRANSMISSION

[75] Inventors: Yasunobu Ito; Kenji Suzuki; Kazuhiro Mikami, all of Aichi, Japan

[73] Assignee: Aisin Aw Kabushiki Kaisha, Japan

[21] Appl. No.: 282,274

[22] Filed: Dec. 9, 1988

[30] Foreign Application Priority Data

Dec. 28, 1987 [JP] Japan ................ 62-329510

[51] Int. Cl.$^5$ ............................................ G08B 21/00
[52] U.S. Cl. ................... 340/438; 340/636; 340/455; 364/424.1
[58] Field of Search ............ 340/636, 449, 438, 455; 364/424.01, 424.03, 424.05, 424.1; 74/856, 857

[56] References Cited

U.S. PATENT DOCUMENTS 4,012,681  3/1977  Finger et al. ................... 340/636
4,208,929  6/1980  Heino ............................. 74/731
4,290,109  9/1981  Taniguchi et al. .............. 340/636
4,644,334  2/1987  Yato et al. ...................... 340/679
4,839,811  6/1989  Kanagae et al. .............. 364/424.03

Primary Examiner—Joseph A. Orsino
Assistant Examiner—Jill Jackson
Attorney, Agent, or Firm—Lorusso & Loud

[57] ABSTRACT

A fail-safe control device for an electronically controlled automatic transmission to be mounted on a vehicle, the fail-safe control device: detects the battery voltage; previously stores a standard battery voltage; makes a comparison between the thus-detected battery voltage and the above-described standard battery voltage; and switches to an emergency mode of turning off all of shift solenoids when the voltage deviates from the standard upon the comparison. As a result of this, generation of defects that shifting from high speed gear stage to a lower speed gear stage due to defective operation of the shift solenoid and disconnection or the like due to the overvoltage of the solenoid can be prevented. Furthermore, if a failure is detected, it can be notified to a drive.

6 Claims, 3 Drawing Sheets

DEVICE AND METHOD OF FAIL-SAFE CONTROL FOR ELECTRONICALLY CONTROLLED AUTOMATIC TRANSMISSION

BACKGROUND OF THE INVENTION

The present invention relates to a fail-safe control against a failure of battery voltage for an electronically controlled automatic transmission to be mounted on a vehicle.

In the conventional electronically controlled automatic transmission, the gear ratio of a T/M and a state whether the lock-up clutch is turned on or off are determined depending upon signals each corresponding to the degree of opening of a throttle and a car speed so that an actuator such as solenoid mounted to the T/M is controlled.

However, in the conventional control method, if the voltage of a battery which serves as a power source for the voltage for driving the solenoid is changed due to deterioration of the battery itself or the lack in charge, the driving of the solenoid confronts a problem so that a problem arises that formal gear shift or the state of the lock-up clutch cannot be maintained. In particular, such problems easily occur in cold regions.

Furthermore, in service factories or the like, there is the fear that a 24V battery is erroneously mounted on a 12V-system vehicle, or two 12V batteries are in series connected, each of which causing a high potential to be applied to a solenoid when the engine is started. As a result of which, a failure such as a disconnection can be arisen. Furthermore, problems arise such that remaining a turned-on state by a solenoid becomes impossible when the voltage is lowered, while disconnection failures can be generated due to heat generated by the solenoid when the voltage is raised.

SUMMARY OF THE INVENTION

An object of the present invention is to provide a fail-safe control device for an electronically controlled automatic transmission and a fail-safe control method for the same capable of preventing generation of defects that a high gear stage is shifted to a lower gear stage due to defects in operation of a shift solenoid, and disconnection or the like due to overvoltage of the solenoid, and notifying a failure, if detected, to a driver.

According to the present invention, a fail-safe control device for an electronically controlled automatic transmission comprising: means for detecting the voltage of a battery; means for storing a standard battery voltage; means for making comparison between the thus-detected voltage and the standard voltage; and means for switching to an emergency mode control by turning off all of the shift solenoids if the voltage deviates from the standard in accordance with the result of the thus-made comparison.

Furthermore, a fail-safe control method for an electronically controlled automatic transmission including a plurality of shift solenoids comprising: detecting the voltage of a battery; storing a standard battery voltage; comprising the thus-detected battery voltage and the above-described standard voltage; switching to an emergency mode control by turning off all of the shift solenoids if the voltage deviates from the standard in accordance with the result of the thus-made comparison.

According to the present invention, the voltage of a battery is always detected, and when the voltage deviates from the standard (for example, deviates from the region between 9V and 16V), all of the shift solenoids are forcedly turned off and thereby switching to a mode (emergency mode) with which a manual drive can be performed by using a shift lever. As a result of this, generation of defects that high gear stage is shifted to a lower gear stage due to defects in operation of a shift solenoid, and disconnection or the like due to overvoltage of the solenoid can be prevented. Furthermore, if such defect is detected, it can be notified to a driver so that a necessity of performing a repair can be indicated.

DESCRIPTION OF THE PREFERRED EMBODIMENT

An embodiment Of the present invention will be in detail described with reference to the drawings.

Figure 1:
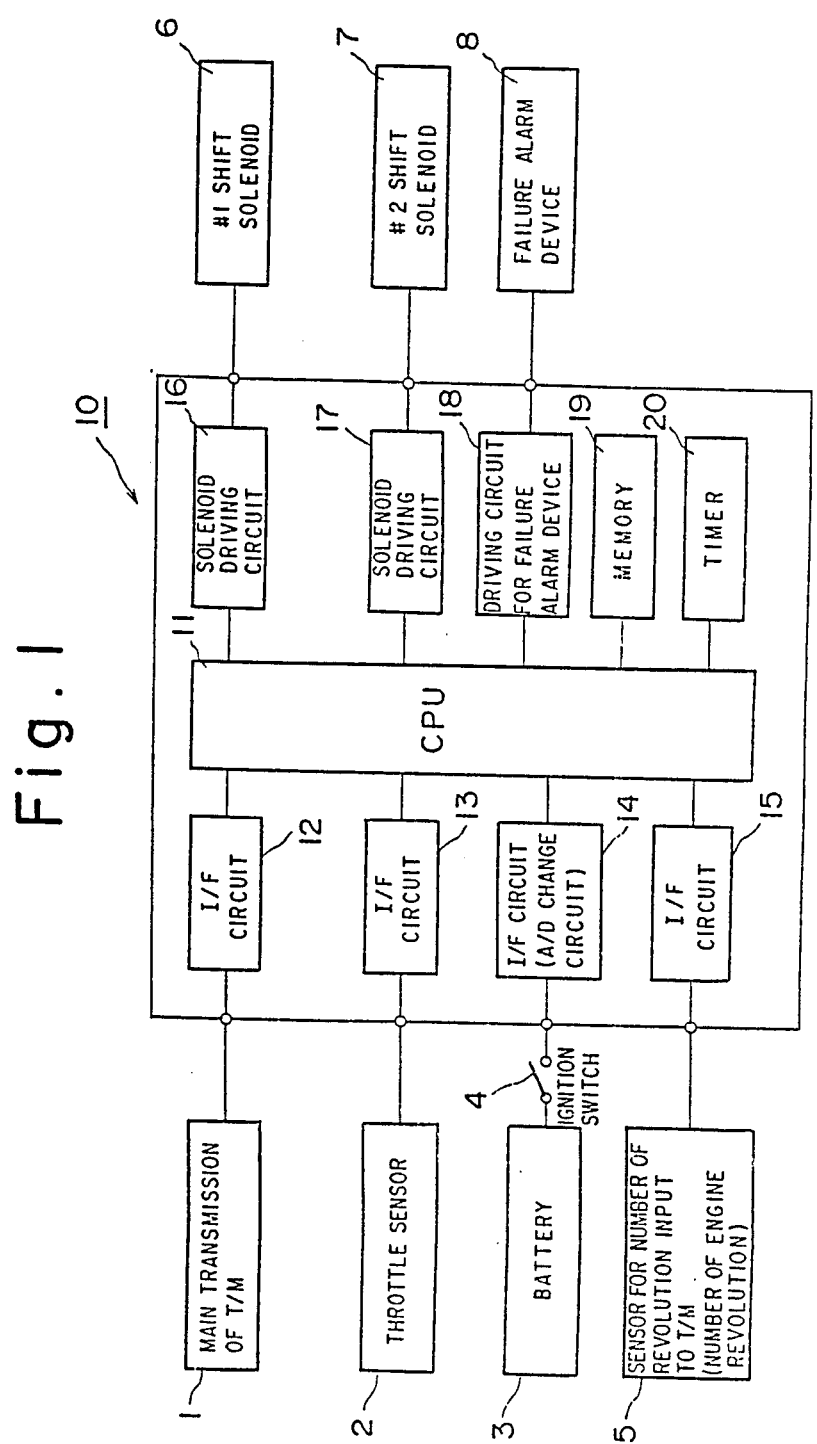
FIG. 1 is an overall structural view of a fail-safe control system for an electronically controlled automatic transmission according to an embodiment of the present invention.

FIG. 1 is an overall structural view of a fail-safe control system for an electronically controlled automatic transmission according to an embodiment of the present invention.

Referring to this drawing, reference numeral 1 represents a sensor for the number of revolution output from T/M, 2 represents a throttle sensor, 3 represents a battery, 4 represents an ignition (IG) switch, and 5 represents a sensor for the number of revolution input to the T/M, this sensor 5 detecting, for example, the number of revolution of a $C_1$ drum (the number of revolution of a $C_0$ drum in case of a FR vehicle) of the T/M for a transverse engined FF vehicle or the number of engine revolution. Reference numeral 6 represents a first shift solenoid, 7 represents a second shift solenoid, 8 represents a failure alarm device, 10 represents an electronic control device, 11 represents a central processing unit (CPU), 12 to 15 each represents an interface circuit, 16 represents a driving circuit for the first shift solenoid 6, 17 represents a driving circuit for the second shift solenoid 7, 18 represents a driving circuit for the failure alarm device, 19 represents a memory, and 20 represents a timer.

In this system, the battery voltage is always detected as described above, and when the thus-detected voltage deviates, by a predetermined level, from a standard for the battery voltage which has been previously stored in the memory 19, it is determined that the battery system is in a failure state. As a result of this, the failure is detected and all of the shift solenoids are forcedly turned off and an emergency mode is realized. In this state, occurrence of failure is notified to a driver by operating the failure alarm device 8 by the driving circuit 18 for the failure alarm device.

Meanwhile, at the time of starting the engine or when the engine is not revolved but only the IG switch 4 is turned on, there is a possibility that the voltage can be lowered even if the battery is in a normal state. In such a case, detection of failure in the battery voltage may be prohibited.

Figure 2:
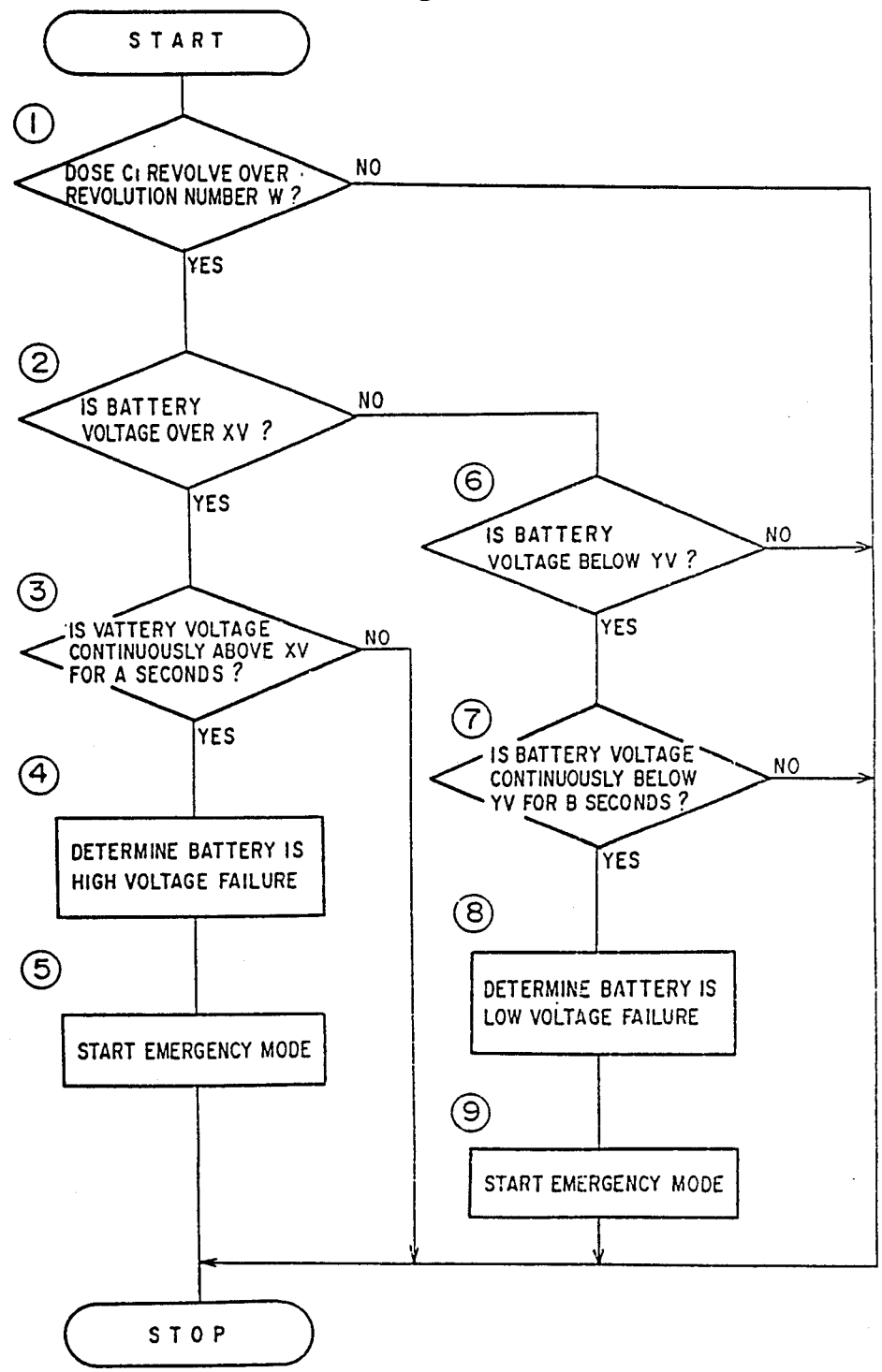
FIG. 2 is a flow chart upon an operation of a fail-safe control system for an electronically controlled automatic transmission according to the present invention.

An operation of the fail-safe control system for an electronically controlled automatic transmission will be in detail described with reference to FIG. 2.

First, it is determined whether the number of revolution of the $C_1$ drum of the T/M exceeds the revolution number W or not (step ①).

Next, if the number of revolution of the $C_1$ drum of the T/M exceeds the revolution number W, it is determined whether the battery voltage exceeds a predetermined voltage XV or not (step ②).

Then, if the battery voltage exceeds the predetermined voltage XV, it is determined whether the battery voltage exceeds XV continuously for A seconds (counted by the timer 20) or not (step ③).

Next, if the battery voltage continuously exceeds XV for A seconds (counted by the timer 20), it is determined that an excessive voltage failure occurs in the battery (a flag representing the excessive voltage failure in the battery is set) (step ④).

If the excessive voltage failure in the battery occurs, the emergency mode is realized (step ⑤).

In this state, the emergency mode is a mode capable of performing a manual shift depending upon the shift lever position, and in this case, a failure is displayed and notified to a driver by operation of the failure alarm device 8.

In the above-described step ②, when the battery voltage does not exceed the predetermined voltage XV, it is determined whether the battery voltage falls below YV or not (step ⑥).

Next, if the battery voltage falls below YV, it is determined whether the battery voltage is continuously YV for B seconds (counted by the timer 20) or not (step ⑦).

Then, if the battery voltage is continuously below YV for B seconds (counted by the timer 20), it is determined that a low voltage failure occurs in the battery (a flag representing the low voltage failure in the battery voltage is set) (step ⑧).

Next, an operation is started with the emergency mode (step ⑨).

In the detection of the battery voltage, at the time of engine start or when only the IG switch 4 is turned on but the engine is not revolved, there is a possibility that the voltage can be lowered even if the battery is in normal state. Therefore, as shown in step ①, the engine revolving condition is set.

Furthermore, in order to prevent occurrence of erroneous detections due to mixture of various noises such as the noises caused by ignition noises or outside noises, a battery voltage signal for an automobile is, as described above, arranged to include time period conditions A and B (see steps ③ and ⑦) required to determine a failure in each high voltage detection and low voltage detection.

Next, the state where the battery voltage changes will be described.

Impulse voltages which can be applied to the battery voltage due to the electromagnetic induction can be exemplified as follows:

(1) Load damp

A load damp is a positive spike voltage which can occur when a load of a generator is rapidly removed. It reaches the maximum level when a battery terminal is removed when the generator revolves at high speed under a great load. In the worst case, a spike voltage whose rise time is 100 μs can be generated.

(2) Induction loadoff

An induction loadoff is a serge voltage of a high frequency which can occur when a great induction load is opened in an ignition coil, wiper motor terminal, horn, air conditioner clutch or the like.

(3) Generator field decay

A generator field decay can be generated by a field inductance at the moment when a key switch is turned off, it having a peak of substantially 120V and pulse width of 200ms.

Figure 3:
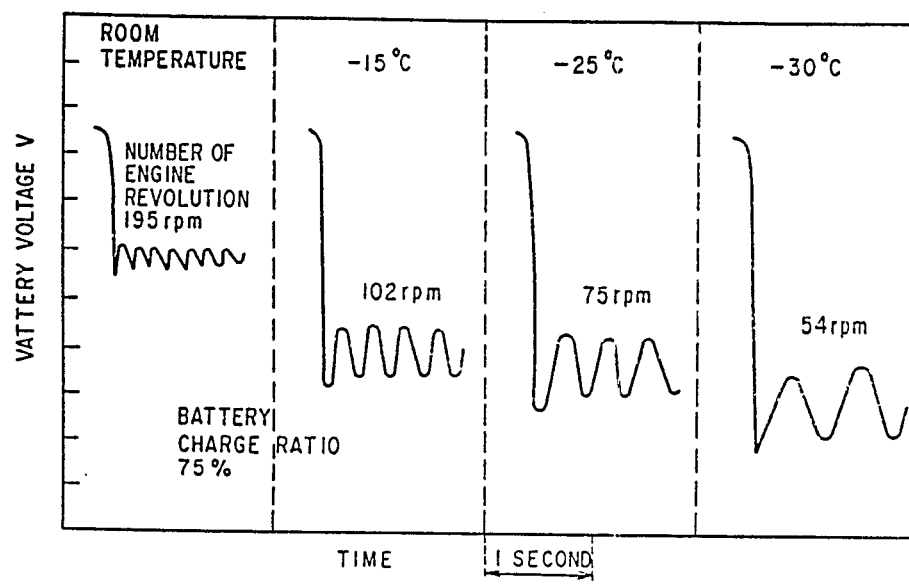
FIG. 3 is an illustration of an example of change in a battery voltage at the time of engine cranking according to the present invention.

FIG. 3 illustrates an example of change in the battery voltage at the time of engine cranking. Referring to this drawing, battery voltages V with respect to the elapsed time (unit: second) in each case of room temperature (number of engine revolution 195 rpm), −15° C. (number of engine revolution 102 rpm), −25° C. (number of engine revolution 75 rpm), and −30° C. (number of engine revolution 54 rpm), are shown in this drawing. In this case, the ratio of battery charge is 75%.

As can be clearly seen from this drawing, a great change in the battery voltage can occur within one second.

Figure 4A:
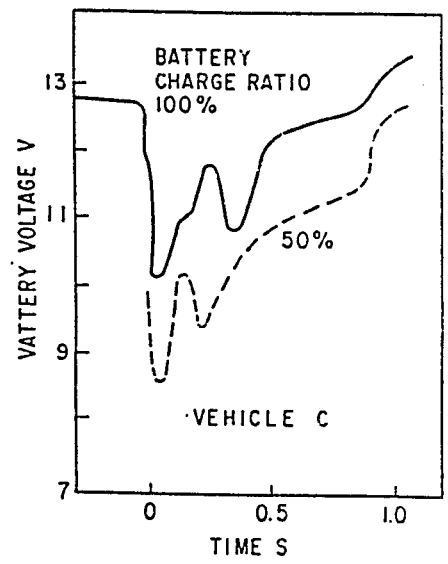
FIG. 4 a and b are illustrations of examples of change in a battery voltage at the time of starting at room temperature according to the present invention.
Figure 4B:
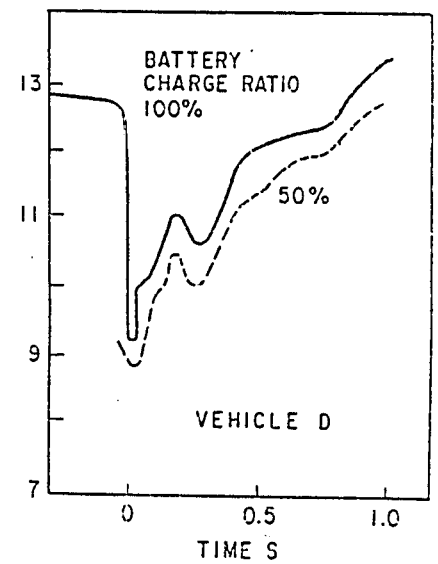

FIG. 4 illustrates an example of change in the battery voltage at the time of starting at room temperature. FIG. 4 (a) illustrates the battery voltage V with respect to time (unit: second) of vehicle C, and FIG. 4 (b) illustrates the battery voltage V with respect to time (unit: second) of vehicle D. In these drawings, the battery charge ratio is expressed by continuous line, which indicating 100%, and by a short dashed line, which indicating 50%.

As can be clearly seen from these drawings, the battery voltage is rapidly (within one second) reduced at the time of engine start. Considering such battery voltage change, time conditions A and B (see steps ③ and ⑦ in FIG. 2) required to determine a failure needs to be at least one second.

As described above, if the voltage deviates from a standard, all of the shift solenoids can be turned off and switch to the emergency mode can be performed.

Furthermore, the upper limit and the lower limit of the standard value of the voltage can be provided for the purpose of monitoring both limits.

In addition, deviation of the voltage from a standard level continued for a predetermined time period needs to occur to determine the fact of the deviation of the voltage from a standard level.

The present invention is not limited to the above-described embodiment; other various modifications based on the spirit of the present invention are possible and they are not excluded from the scope of the present invention.

What we claim is:

1. A fail-safe control device for an electrically controlled automatic transmission including a plurality of shift solenoids comprising:
   (a) means for detecting a battery voltage;
   (b) means for storing a standard battery voltage range;
   (c) means for comparing said detected battery voltage and said stored standard battery voltage range to each other;
   (d) means for determining when said detected battery voltage is outside of said stored standard battery voltage range for a duration of time greater than a predetermined duration of time; and (e) means for switching to an emergency mode control by turning off all of the shift solenoids when said detected battery voltage is determined to be outside of said stored standard battery voltage range more than said predetermined duration of time.

2. A fail-safe control device for an electrically controlled automatic transmission according to claim 1, wherein said stored standard battery voltage range includes upper and lower limits.

3. A fail-safe control device for an electrically controlled automatic transmission according to claim 1, wherein once switched on, the emergency mode control is maintained for a predetermined time period.

4. A fail-safe control device for an electronically controlled automatic transmission according to claim 1, wherein when said detected battery voltage deviates from said stored standard battery voltage range, a failure alarm device is arranged to be operated.

5. The fail-safe control device for an electronically controlled automatic transmission as set forth in claim 1, wherein the transmission is capable of being manually controlled and wherein said emergency mode control corresponds to manual control of the transmission.

6. A fail-safe control method for an electronically controlled automatic transmission including a plurality of shift solenoids comprising:

(a) detecting a battery voltage;
(b) storing a standard battery voltage range;
(c) comparing the detected battery voltage and said stored standard battery voltage range to each other;
(d) determining when said detected battery voltage is outside of said stored standard battery voltage range for a duration of time greater than a predetermined duration of time; and
(e) switching to an emergency mode by turning off all of said shift solenoids when said detected battery voltage is determined to be outside of said stored standard battery voltage range more than said predetermined duration of time.

* * * * *

UNITED STATES PATENT AND TRADEMARK OFFICE
CERTIFICATE OF CORRECTION

PATENT NO.  : 4,939,502
DATED       : July 3, 1990
INVENTOR(S) : ITO et al

It is certified that error appears in the above-identified patent and that said Letters Patent is hereby corrected as shown below:

Col. 1, line 39, "inventiOn" should read --invention--;
       line 61, "comprising" should read --comparing--.

Col. 2, line 31, "Of" should read --of--.

Col. 3, line 36, after "continuously" insert --below--.

Col. 4, line 58, "electrically" should read --electronically--.

Col. 5, line 10, "electrically" should read --electronically--;
       line 14, "electrically" should read --electronically--.

Signed and Sealed this

Twenty-second Day of October, 1991

*Attest:*

HARRY F. MANBECK, JR.

*Attesting Officer*      *Commissioner of Patents and Trademarks*